United States Patent
Dutta et al.

(10) Patent No.: US 12,170,329 B2
(45) Date of Patent: Dec. 17, 2024

(54) HIGH VOLTAGE MOSFET DEVICE WITH IMPROVED BREAKDOWN VOLTAGE

(71) Applicant: GlobalFoundries U.S. Inc., Malta, NY (US)

(72) Inventors: Anupam Dutta, Malta, NY (US); Vvss Satyasuresh Choppalli, Malta, NY (US); Rajendran Krishnasamy, Malta, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 386 days.

(21) Appl. No.: 17/692,218

(22) Filed: Mar. 11, 2022

(65) Prior Publication Data

US 2023/0290880 A1  Sep. 14, 2023

(51) Int. Cl.
*H01L 29/78* (2006.01)
*H01L 21/3215* (2006.01)
(Continued)

(52) U.S. Cl.
CPC ...... *H01L 29/7816* (2013.01); *H01L 21/3215* (2013.01); *H01L 21/823493* (2013.01);
(Continued)

(58) Field of Classification Search
CPC ........... H01L 21/26506; H01L 21/3215; H01L 21/322; H01L 21/76224; H01L 21/76243; H01L 21/76283; H01L 21/823493; H01L 21/823892; H01L 29/0611; H01L 29/0619; H01L 29/0623; H01L 29/0653;
(Continued)

(56) References Cited

U.S. PATENT DOCUMENTS 6,617,656 B2  9/2003  Lee et al.
6,989,567 B2  1/2006  Tornblad et al.
(Continued)

OTHER PUBLICATIONS

Xie et al., "A novel Resurf LDMOS with embedded CB-layer", 6th International Conference on Solid-State and Integrated Circuit Technology. Proceedings (Cat. No. 01EX443), 2001, pp. 174-177, IEEE.
(Continued)

*Primary Examiner* — Cheung Lee
(74) *Attorney, Agent, or Firm* — VIERING JENTSCHURA & PARTNER MBB

(57) ABSTRACT

According to various embodiments, there is provided a MOSFET device. The MOSFET device may include a substrate; a first doped region disposed in the substrate; a second doped region disposed in the substrate, wherein the first doped region and the second doped region are laterally adjacent to each other; a third doped region disposed in the first doped region; a fourth doped region disposed in the second doped region; a gate disposed on the substrate, over the first and second doped regions, and between the third and fourth doped regions; and at least one high resistance region embedded in at least the second doped region, wherein the first doped region has a first conductivity type, wherein the second doped region, the third doped region, and the fourth doped region have a second conductivity type, wherein the first conductivity type and the second conductivity type are different.

20 Claims, 19 Drawing Sheets

(51) Int. Cl.
*H01L 21/8234* (2006.01)
*H01L 29/06* (2006.01)
*H01L 29/66* (2006.01)

(52) U.S. Cl.
CPC ...... *H01L 29/0611* (2013.01); *H01L 29/0623* (2013.01); *H01L 29/66681* (2013.01)

(58) Field of Classification Search
CPC ............. H01L 29/0856; H01L 29/0873; H01L 29/1045; H01L 29/66659; H01L 29/66681; H01L 29/7816; H01L 29/7824; H01L 29/7835
See application file for complete search history.

(56) References Cited

U.S. PATENT DOCUMENTS

| | | |
|---|---|---|
| 7,851,329 B2 | 12/2010 | Shin |
| 8,674,442 B2 | 3/2014 | Pang et al. |
| 10,832,940 B2 | 11/2020 | Shank et al. |
| 2012/0211832 A1 | 8/2012 | Chu et al. |
| 2014/0231927 A1* | 8/2014 | Pang ................ H01L 29/0847 438/294 |
| 2023/0023179 A1* | 1/2023 | Ji ...................... H01L 29/66689 |

OTHER PUBLICATIONS

Zhang et al., "A Novel SOI LDMOS with A Trench Gate and Field Plate and Trench Drain for RF Applications", International Symposium on Communications and Information Technologies (ISCIT 2007), 2007, pp. 34-39, IEEE.

Han et al., "A Scalable Model for the Substrate Resistance in Multi-Finger RF MOSFETs", IEEE MTT-S International Microwave Symposium Digest, 2003, pp. 2105-2108, IEEE.

Yuxi et al., "Layout Optimization and Modeling of an ESD-protection n-MOSFET in 0.13um Silicide CMOS Technology", International Conference on Electronic Packaging Technology & High Density Packaging, 2008, 6 pages, IEEE.

Cao et al., "Novel Superjunction LDMOS with Multi-Floating Buried Layers", 29th International Symposium on Power Semiconductor Devices and IC's (ISPSD), 2017, pp. 283-286, IEEE.

* cited by examiner

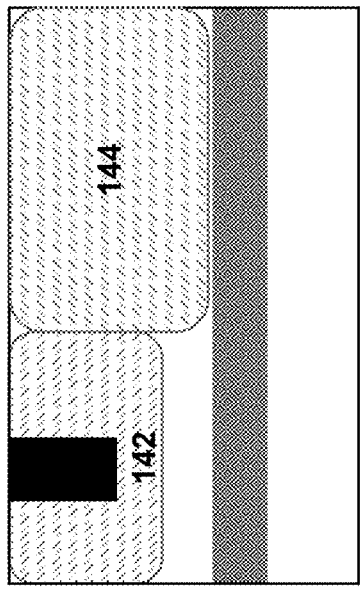
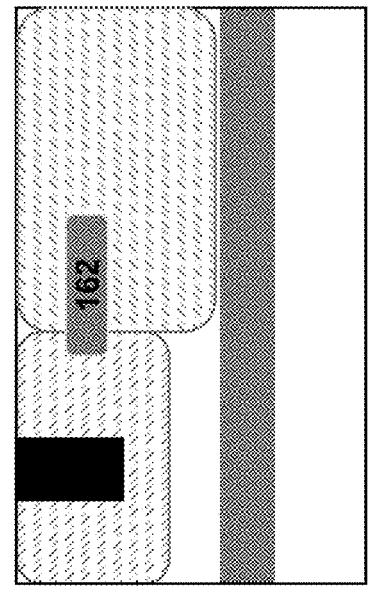
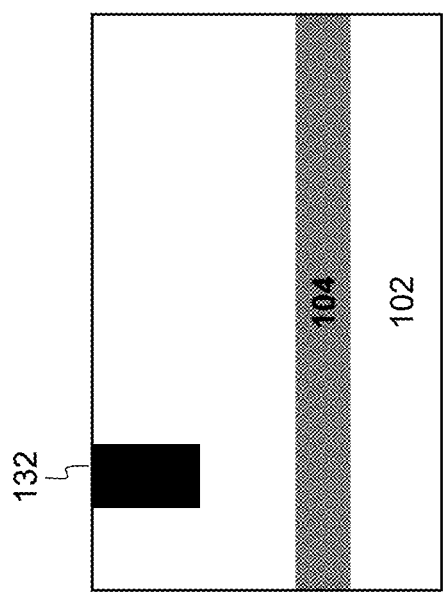
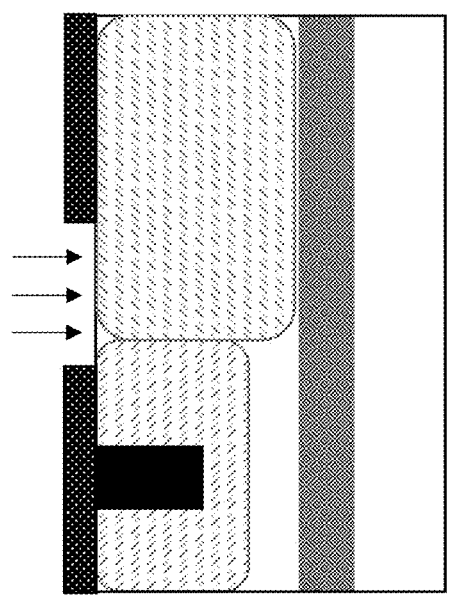

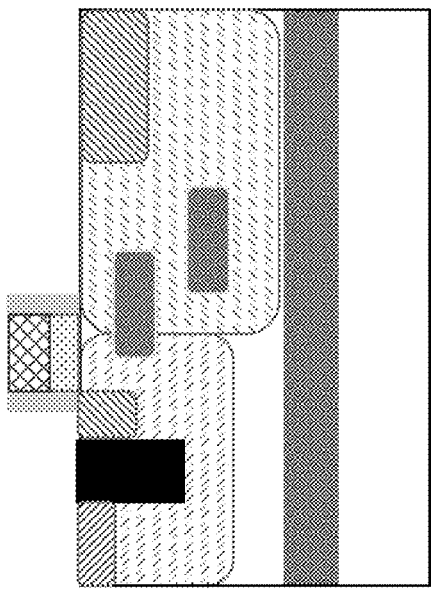
FIG. 6A
FIG. 6B
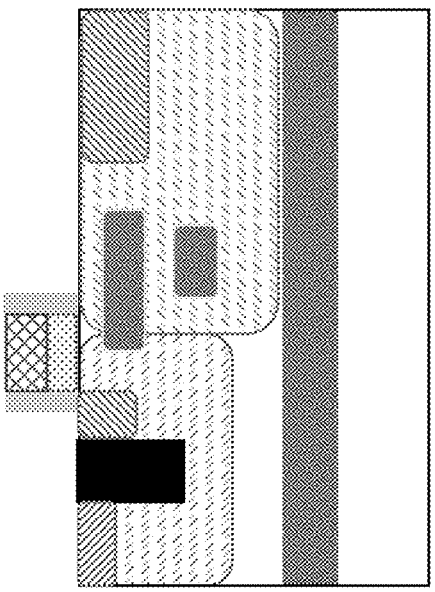
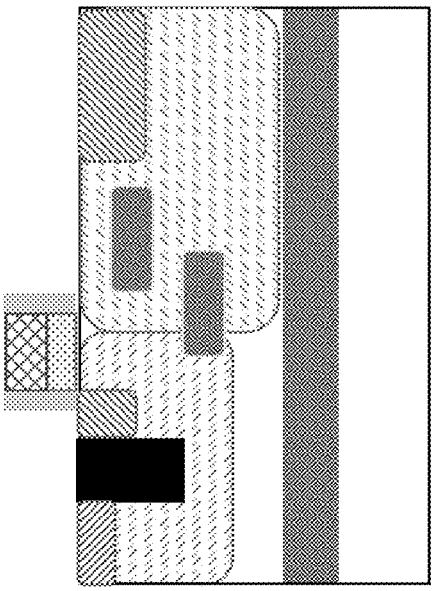
FIG. 6C
FIG. 6D

HIGH VOLTAGE MOSFET DEVICE WITH IMPROVED BREAKDOWN VOLTAGE

TECHNICAL FIELD

Various embodiments relate to metal-oxide field effect transistors (MOSFET) semiconductor devices, in particular, high voltage embedded MOSFET devices, and methods of fabricating such devices.

BACKGROUND

MOSFET devices are commonly used in high voltage applications. Such MOSFET devices may include, for example, asymmetric MOSFET devices, such as, EDMOS (Extended Drain MOSFET) devices and LDMOS (Laterally Diffused MOSFET) devices. MOSFET transistors can operate over a wide range of breakdown voltages. A main challenge in high voltage applications is the breakdown voltage ($V_{br}$) and the resistance in the on-state ($R_{on}$) (including the sum of the parasitic resistances of the source ($R_s$), the channel ($R_{ch}$), the drift ($R_{drift}$), and the drain ($R_d$)). In a conventional MOSFET device, increasing the breakdown voltage also increases the resistance in the on-state. Therefore, there is a need to provide an embedded MOSFET device with a high $V_{br}$ but a low $R_{on}$.

SUMMARY

According to various embodiments, there may be provided a semiconductor device. The semiconductor device may include a substrate; a first doped region disposed in the substrate; a second doped region disposed in the substrate, wherein the first doped region and the second doped region are laterally adjacent to each other; a third doped region disposed in the first doped region; a fourth doped region disposed in the second doped region; a gate disposed on the substrate, over the first and second doped regions, and between the third and fourth doped regions; and at least one high resistance region embedded in at least the second doped region, wherein the first doped region has a first conductivity type, wherein the second doped region, the third doped region, and the fourth doped region have a second conductivity type, wherein the first conductivity type and the second conductivity type are different.

According to various embodiments of the semiconductor device, the at least one high resistance region may be embedded at a depth below a surface of the substrate in the second doped region and above a depth of the second doped region.

According to various embodiments of the semiconductor device, the at least one high resistance region may be disposed between the third doped region and the fourth doped region so as to be spaced apart from the third doped region and the fourth doped region.

According to various embodiments of the semiconductor device, at least half of the at least one high resistance region may be embedded in the second doped region.

According to various embodiments of the semiconductor device, a substantial portion of the at least one high resistance region may be embedded in the second doped region.

According to various embodiments of the semiconductor device, the at least one high resistance region may be completely embedded in the second doped region.

According to various embodiments of the semiconductor device, the at least one high resistance region may include at least one high resistance semiconductor layer. According to various embodiments of the semiconductor device, the at least one high resistance semiconductor region may include at least one amorphous semiconductor layer.

According to various embodiments of the semiconductor device, the at least one high resistance region may include a plurality of high resistance regions arranged in a stack. According to various embodiments of the semiconductor device, the plurality of high resistance regions may be arranged in a step-like stack.

According to various embodiments of the semiconductor device, the at least one high resistance region may include a first high resistance region and a second high resistance region, the first high resistance region disposed over the second high resistance region. According to various embodiments, the first high resistance region may overlap the second high resistance region. According to various embodiments, the first high resistance region may completely overlap the second high resistance region.

According to various embodiments of the semiconductor device, a deep high resistance layer may further be disposed in the substrate and extending under the first doped region and the second doped region. According to various embodiments of the semiconductor device, the deep high resistance layer may include a buried oxide layer or an amorphous semiconductor layer.

According to various embodiments of the semiconductor device, a fifth doped region may be disposed in the first doped region, the fifth doped region having the first conductivity type, wherein the fifth doped region is in direct contact with the third doped region.

According to various embodiments of the semiconductor device, the gate may overlap at least a portion of the at least one high resistance region.

According to various embodiments of the semiconductor device, the gate may completely overlap the at least one high resistance region.

According to various embodiments of the semiconductor device, the gate does not overlap the at least one high resistance region.

According to various embodiments of the semiconductor device, the first doped region may be a well region, the second doped region may be a drift region, the third doped region may be a source region, and the fourth doped region may be a drain region Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIGS. 4A to 4J show simplified cross-sectional views illustrating a process for fabricating the MOSFET devices according to various non-limiting embodiments.

FIGS. 6A to 6D show simplified cross-sectional views of additional various configurations of the high resistance layer according to various non-limiting embodiments.

DESCRIPTION

Figure 1A:
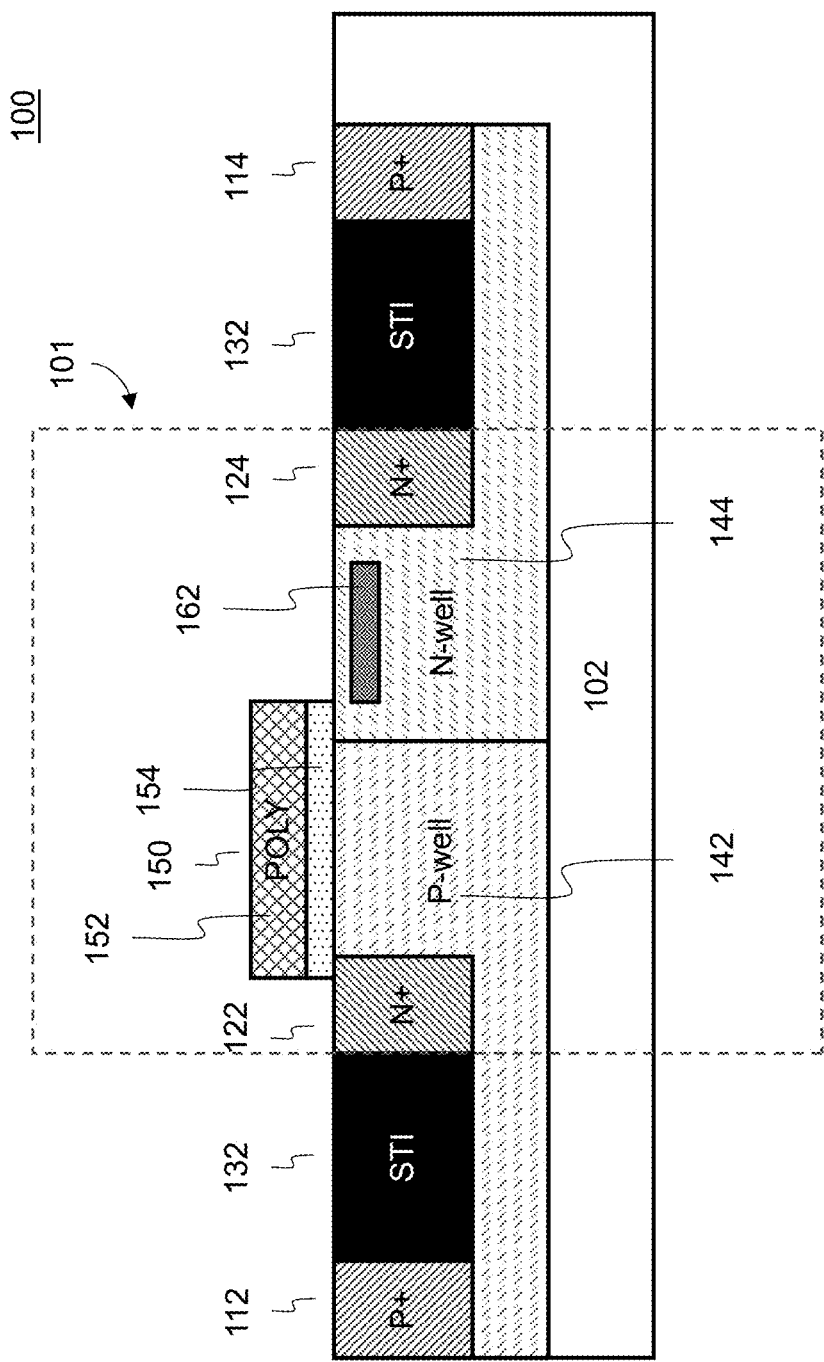
FIGS. 1A-1C show simplified cross-sectional views of a device according to various non-limiting embodiments.

The present disclosure generally relates to improving breakdown voltage while maintaining a low device ON resistance in MOSFET devices. Various embodiments relate to MOSFET devices for high voltage applications. Various embodiments include at least one embedded amorphous layer in the drift region. The high voltage MOSFET devices of the present disclosure provide improved breakdown voltage ($V_{br}$) without compromising a low device ON resistance ($R_{on}$), that is, the resistance when the MOSFET device is in operation. Various embodiments relate to MOSFET devices that may be integrated into semiconductor devices with improved high voltage performance.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while considering that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
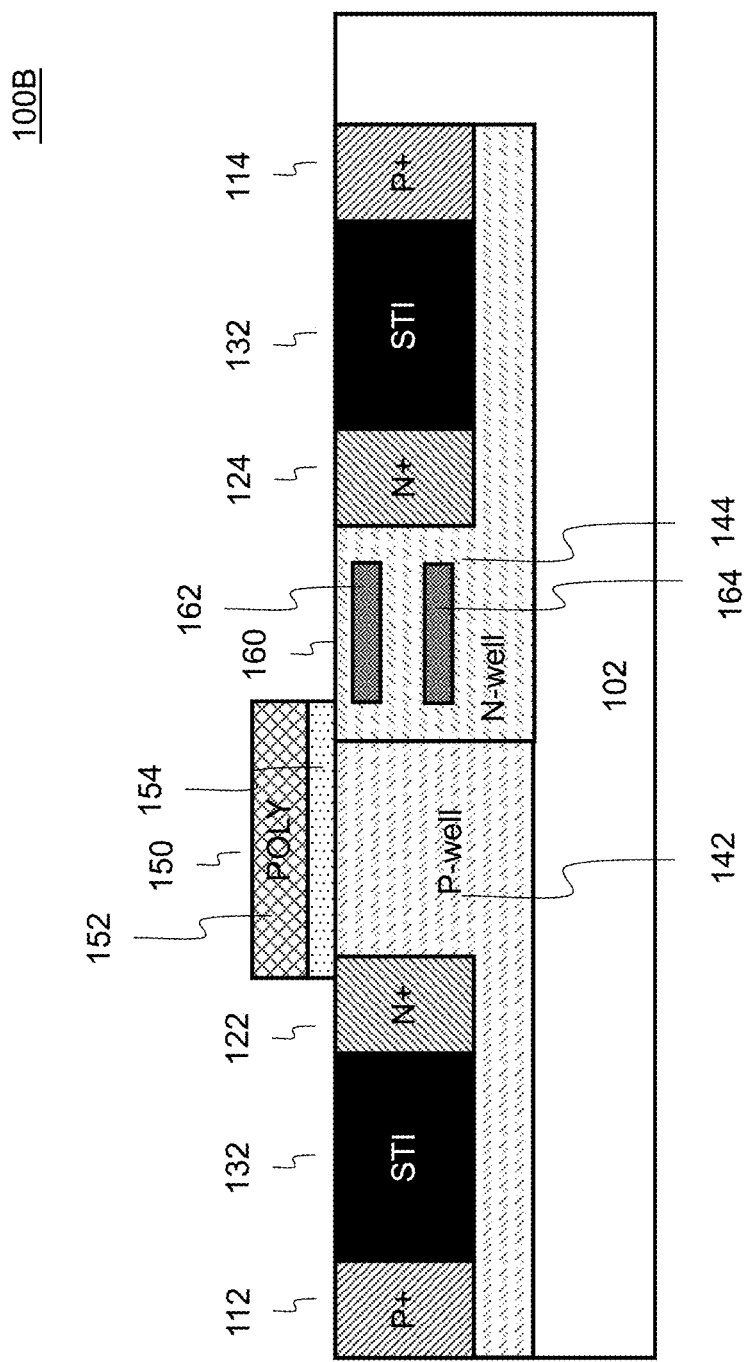
Figure 1C:
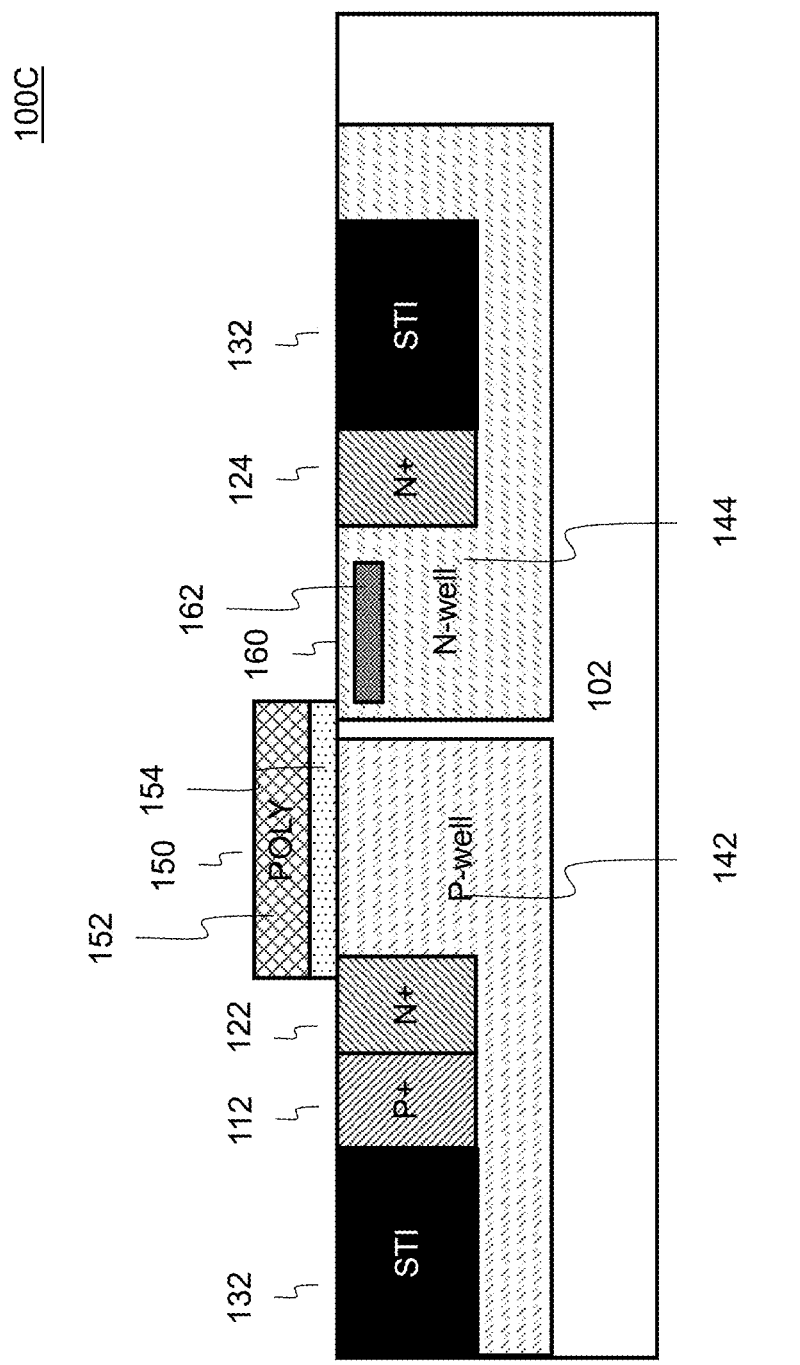

FIGS. 1A-1C show simplified cross-sectional views of MOSFET devices according to various non-limiting embodiments of the present disclosure.

As shown in FIG. 1A, the MOSFET device 100 may include a substrate 102. The substrate 102, for example, may be a silicon substrate. The substrate 102 may also be a silicon germanium, germanium, gallium arsenide, or crystal-on-insulator (COI) such as silicon-on-insulator (SOI) substrate. The substrate 102 may be an undoped substrate. In some embodiments, for example, the substrate 102 may be lightly doped with p-type dopants. In some embodiments, the substrate 102 may be provided with other types of dopants or dopant concentrations.

The substrate 102 may include a plurality of doped regions having different dopant concentrations. For example, the device 100 may include heavily doped (+++), intermediately doped (++) and lightly doped (+) regions, where the dopant type may be p or n polarity type. A lightly doped region may have a dopant concentration of about 1e14-2e16 cm$^{-3}$, an intermediately doped region may have a dopant concentration of about 1e16-1e18 cm$^{-3}$, and a heavily doped region may have a dopant concentration of about 1e18-1e21 cm$^{-3}$. Providing other dopant concentrations for the different doped regions may also be useful. P-type dopants may include boron (B), aluminum (Al), indium (In) or a combination thereof. N-type dopants may include phosphorous (P), arsenic (As), antimony (Sb) or a combination thereof.

The substrate 102 may include a device portion 101. The device portion 101, for example, may include a high voltage region for a high voltage device, such as an extended drain MOS transistor (EDMOS). The device portion 101 may include other types of devices, including regions for other high or low voltage devices. The device portion 101 may be isolated from other portions by a device isolation region. For example, the device isolation region 132 may surround the device portion 101. The device isolation region 132, for example, may be shallow trench isolation (STI) region or a deep trench isolation (DTI) region in the substrate 102. The device isolation region 132 may be a ring-like shape when the layout of the device is viewed in a top plan view.

The device portion 101 may include a first doped region 142. The first doped region 142 may be disposed in the substrate 102 in the device portion 101. For example, the first doped region 142 may serve as a body well for the device portion 101. The first doped region 142 may include dopants of a first conductivity type. The first doped region 142 may be intermediately doped. For example, the first doped region 142 may have a dopant concentration of about $1e16$-$1e18$ cm$^{-3}$. A top surface of the first doped region 142 may be a top surface of the substrate 102. The depth of the first doped region 142 may be about 0.5-3 depending on the design voltage of the device.

The device portion 101 may include a second doped region 144. The second doped region 144 may be disposed in the substrate 102 in the device portion 101. For example, the second doped region 144 may serve as a drift well for the device 100. The second doped region 144 may include dopants of a second conductivity type. The second doped region 144 may be intermediately doped. For example, the second doped region 144 may have a dopant concentration of about $1e16$-$1e18$ cm$^{-3}$. A top surface of the second doped region 144 may be a top surface of the substrate 102. The depth of the second doped region 144 may be about 0.5-3 nm depending on the design voltage of the device.

The first doped region 142 and the second doped region 144 may be adjacent to each other. In various embodiments, the first doped region 142 and the second doped region 144 may be in direct contact with each other. For example, FIG. 1A illustrates the first doped region 142 and the second doped region 144 may be in direct contact with each other. In other various embodiments, the first doped region 142 and the second doped region 144 may be separated by an intrinsic semiconductor region therebetween. For example, FIG. 1C illustrates the first doped region 142 and the second doped region 144 may be separated by an intrinsic semiconductor region therebetween. The depth of the second doped region 144 may be deeper than the depth of the first doped region 142. In some embodiments, the depth of the second doped region 144 may be about the same or shallower than the depth of the first doped region 142.

The first doped region 142 may include a third doped region 122. For example, the third doped region 122 may serve as a source region for the device 100. The third doped region 122 may include dopants of a second conductivity type. The third doped region 122 may be heavily doped. For example, the third doped region 122 may have a dopant concentration of about $5e19$-$5e20$ cm$^{-3}$. A top surface of the third doped region 122 may be a top surface of the substrate 102. The depth of the third doped region 122 may be about 0.1-0.3 μm.

The second doped region 144 may include a fourth doped region 124. For example, the fourth doped region 124 may serve as a drain region for the device 100. The fourth doped region 124 may include dopants of a second conductivity type. The fourth doped region 124 may be heavily doped. For example, the fourth doped region 124 may have a dopant concentration of about $5e19$-$5e20$ cm$^{-3}$. A top surface of the fourth doped region 124 may be a top surface of the substrate 102. The depth of the fourth doped region 124 may be about 0.1-0.3 μm.

The third doped region 122 and the fourth doped region 124 may have different depths.

The device portion 101 may include a gate 150 disposed on the substrate 102 and between the third doped region 122 and fourth doped region 124. The gate 150 may be disposed on a top surface of the substrate 102. The gate region 150 may be disposed to extend over a portion of the first doped region 142 and a portion of the second doped region 144. One end of the gate 150 may overlap an end portion of the third doped region 122.

The gate 150 may include a gate electrode 152 over a gate dielectric 154. The gate dielectric 154, for example, may be silicon oxide while the gate electrode 152 may be polysilicon. The thicknesses of the gate dielectric and gate electrode are determined by the device requirements, for example, breakdown voltage, operating voltage and other operating parameters. In some embodiments, the gate electrode 152 may be a doped electrode. For example, the gate electrode 152 may be polysilicon doped with dopants of a first conductivity type. Other types of gate dielectrics and gate electrodes as well as thicknesses may also be useful. For example, the gate dielectric 154 may be a high k gate dielectric and/or the gate electrode 152 may be a metal gate electrode. Other configurations of gate layers of the gate may also be useful. The gate 150, for example, may traverse the device portion 101 along the z direction or channel width direction. The width of the gate along a channel length direction of the transistor device may be, for example, about 0.6 μm. Providing a gate having other widths may also be useful. The gate width, for example, may depend on the operating voltage and technology node. As shown, the channel length direction is in the x direction. The x and z directions, for example, are orthogonal directions.

The second doped region 144 may be contiguous and extends from the fourth doped region 124 to first doped region 142. A first end of the gate 150 overlaps only a portion of the third doped region 122 and a second end of the gate 150 overlaps only a portion of the second doped region 144 to provide a channel area under the gate 150. The fourth doped region 124 (e.g., the drain region) is spaced apart from the gate 150. The distance from the fourth doped region 124 (e.g., the drain region) to the beginning of the channel under the gate 150 may be a drift distance of the device 100. The portion of the second doped region 124 between the fourth doped region 124 (e.g., the drain region) to the beginning of the channel under the gate 150 may be a drift region of the device 100.

The device portion 101 may include at least one high resistance region 162 embedded in the drift region of the second doped region 144. The high resistance region 162 may be disposed at various depths. The depth may determine the breakdown voltage of the device portion 101. The depth may range from below a surface of the substrate in the second doped region to above the depth of the second doped region. The high resistance region 162 may be disposed at a first depth. The first depth may be shallow and disposed towards the top surface of the substrate. The high resistance region 162 may be disposed at a second depth. The second depth may be deep and disposed towards the depth of the second doped region 144. The high resistance region 162 may be disposed at a third depth. The third depth may be intermediate between the first depth and the second depth. The breakdown voltage may increase as the depth increases. The high resistance region 162 may also be a high impedance region. In some embodiments, the device may include a second high resistance region 164 embedded in the second doped region 144. In some embodiments, the device may further include a third high resistance region 166 embedded in the second doped region 144.

Each high resistance region may have a thickness of about 0.01 μm to about 0.7 μm. The high resistance region may have a length of about 0.05 μm to about 1 μm. The length may be more than 1 μm. The length depends on the dimensions of the drift region.

In various embodiments, a device portion 101 may include a plurality of high resistance regions 160 (e.g., 2, 3, 4, . . . ) embedded in the drift region. For example, referring to FIG. 1B, a device 100B may further include a second high resistance region 164 embedded in the drift region of the second doped region 144. The high resistance region 162 and the second high resistance region 164 may be arranged in a stack configuration. That is, the high resistance region 162 may be disposed over the second high resistance region 164. The high resistance region 162 may be disposed at a shallower depth and the second high resistance region 164 may be disposed at a deeper depth. The high resistance region 162 and the second high resistance region 164 may be vertically spaced apart from each other. In various embodiments, the first high resistance region 162 may be disposed to completely overlap the second high resistance region 164. For example, the first high resistance regions 162 and the second high resistance region 164 may be disposed in a stacked column (e.g., co-linear) configuration. That is, the ends of the high resistance regions may be aligned. In various embodiments, the first high resistance region 162 may be disposed to partially overlap the second high resistance region 164. For example, the first high resistance regions 162 and the second high resistance region 164 may be disposed in a staggered or tiered (e.g., step) configuration. That is, the stacked high resistance regions may be arranged where an end of one high resistance region is offset from an end of another high resistance region to form an ascending or descending step-like stack. In various embodiments, the first high resistance regions 162 and the second high resistance region 164 may have the same dimensions. In various embodiments, the first high resistance regions 162 and the second high resistance region 164 may have different dimensions.

Each high resistance region 162, 164, may be disposed between the third doped region and the fourth doped region. Each high resistance region 162, 164, may be laterally spaced apart from the third doped region and laterally spaced apart from the fourth doped region. Each high resistance region may be laterally spaced part from the fourth doped region by at least about 0.05 μm.

In some embodiments, the at least one high resistance region 162, 164 may be completely embedded within the drift region of the second doped region 144. In some embodiments, the at least one high resistance region 162, 164 may be embedded within the first doped region 142 and the second doped region 144, but more than half of the at least one high resistance region 162, 164 is within the drift region of the second doped region 144. In some embodiments, a substantial portion of the at least one high resistance region may be embedded in the second doped region.

In some embodiments, the at least one high resistance region 162, 164 may be completely or substantially covered (e.g., overlapped) by the gate 150. In some embodiments, the at least one high resistance region 162, 164 may be partially covered by the gate. In some embodiments, the at least one high resistance region 162, 164 may not be covered (e.g., overlapped) by any part of the gate 150.

The high resistance regions should have a resistance on the order of Mega Ohms (e.g., greater than 1 Mega (1e6) Ohms). The high resistance regions may be high resistance semiconductor regions embedded in the drift region. For a non-limiting example, the high resistance semiconductor regions may be embedded amorphous regions in the drift region. That is, each high resistance region may be a layer of amorphous semiconductor. Nevertheless, the high resistance regions may not be regions of insulator material, which are not suitable. In various embodiments, the high resistance regions must be high resistance semiconductor regions.

A layer of amorphous semiconductor may be provided by performing a series of ion implantations (e.g., chained implants) in the substrate 102. A depth of the amorphous layer may be based on a configured depth profile of the implanted ions. The substrate outside of a targeted depth range may receive negligible damage during the ion implantations and remain single crystal. Each of the ion implantations performed to form an amorphous layer introduces energetic ions that penetrate the semiconductor material of the semiconductor substrate 102. The energetic ions, as they penetrate through the semiconductor substrate 102, lose energy via scattering events with atoms and electrons in the constituent materials. Energy lost in nuclear collisions, which dominates at low kinetic energies after energy loss, displaces target atoms of the semiconductor substrate 102 from their original lattice sites, which damages the crystal lattice structure of the semiconductor substrate 102 and generates point defects.

The ions may be any suitable HR dopant and implanted into the semiconductor substrate 102 with configurable implantation conditions. The conditions (e.g., ion species, dose, kinetic energy) of each implantation may be configured to tune the characteristics (e.g., depth profile and amount of resistivity) of the amorphous layer. In particular, each implantation may introduce ions at a different kinetic energy and with a different dose to provide a depth profile of stopped ion concentration and a related amount of resistivity to the crystal lattice that are each parameterized by a projected range and a range straggle. The crystal lattice structure of the semiconductor substrate may be amorphized. There may be other ways to create high resistance semiconductor regions.

The first doped region 142 may include a fifth doped region 112. The fifth doped region may be included in high voltage devices. For example, the fifth doped region 112 may serve as a body bias contact region to bias the body of the transistor 100 for high voltage applications. The fifth doped region 112 may include dopants of a first conductivity type. The fifth doped region 112 may be heavily doped. For example, the fifth doped region 112 may have a dopant concentration of about 5e19-5e20 cm$^{-3}$. The depth of the fourth doped region 124 may be about 0.1-0.3 μm.

The fifth doped region 112 may be disposed away from the gate. For example, the third doped region 122 may be disposed between the fifth doped region 112 and the gate 150 to separate the fifth doped region 112 from the gate 150. In various embodiments, where the body is biased with a different voltage than the voltage provided at the source region, the fifth doped region 112 may be separated from the third doped region 122 by a shallow trench isolation (STI) region 132 disposed in the substrate 102. For example, referring to FIG. 1A, STI 132 may be disposed between the third doped region 122 and the fifth doped region 112. STI 132 may surround the device portion 101 when the layout of the device is viewed from a top plan perspective. However, STI 132 may be optional. In various embodiments, where the body is biased with a same voltage as provided at the source region, the fifth doped region 112 and the third doped region 122 may be in direct contact. For example, referring to FIG. 1C, the third doped region 122 and the fifth doped region 112 may be in direct contact and the fifth doped region 112 may be disposed between STI 132 and the third doped region 122.

In various embodiments, the MOSFET devices may be high voltage MOSFET devices. High voltage MOSFET devices may include one or more body bias contact regions. The first doped region 142 may include a sixth doped region 114. The sixth doped region 114 may be similar to the fifth doped region and may also serve as a body bias contact region. The sixth doped region 114 should be separated from the fourth doped region 124. The sixth doped region 114 may be separated from the fourth doped region 124 by STI 132.

Referring to FIGS. 1A-1C, in the non-limiting example illustrated, the first conductivity type is shown as a P type and the second conductivity type is shown as an N type. However, in various other examples, the first conductivity type may be an N type and the second conductivity type may be a P type.

Figure 2A:
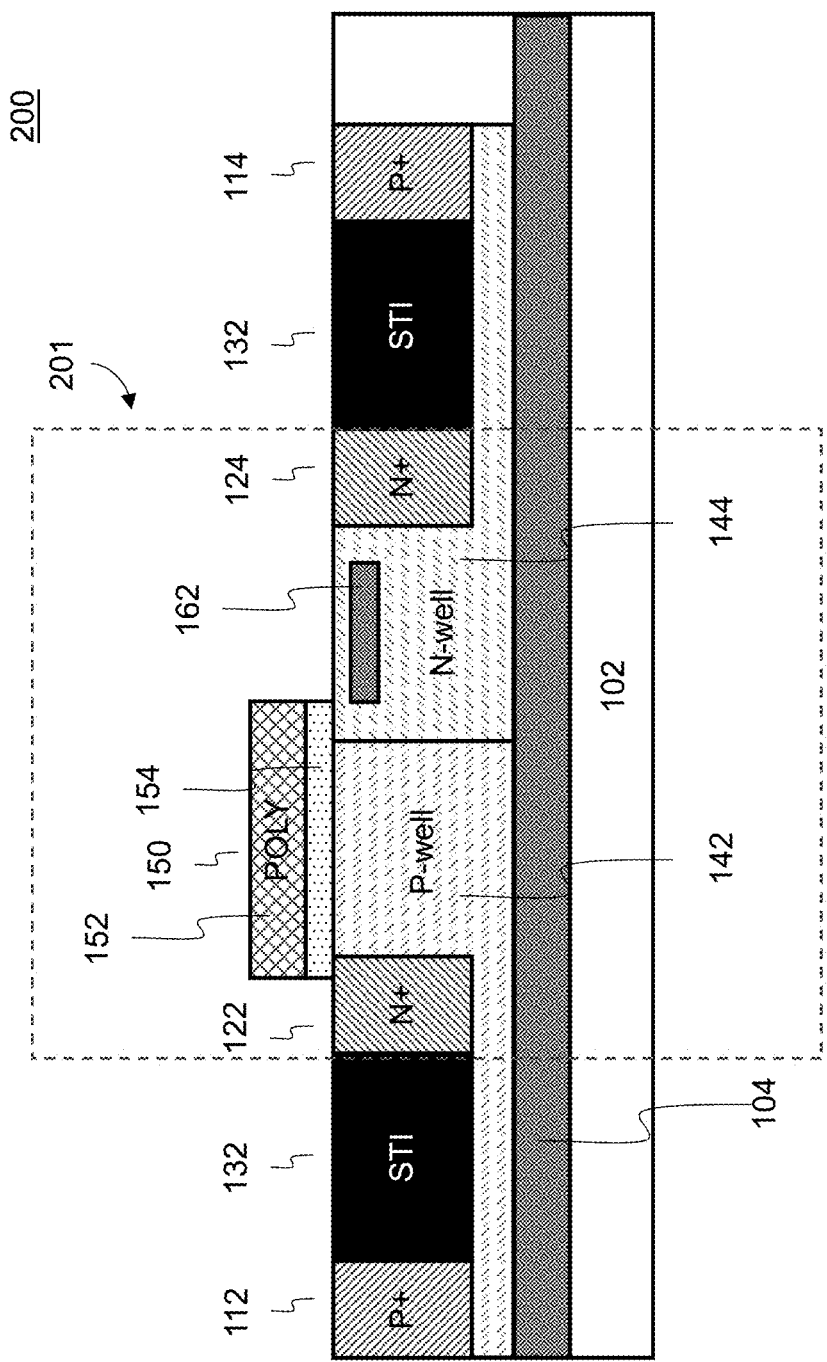
FIGS. 2A-2C show simplified cross-sectional views of a device according to various non-limiting embodiments.
Figure 2B:
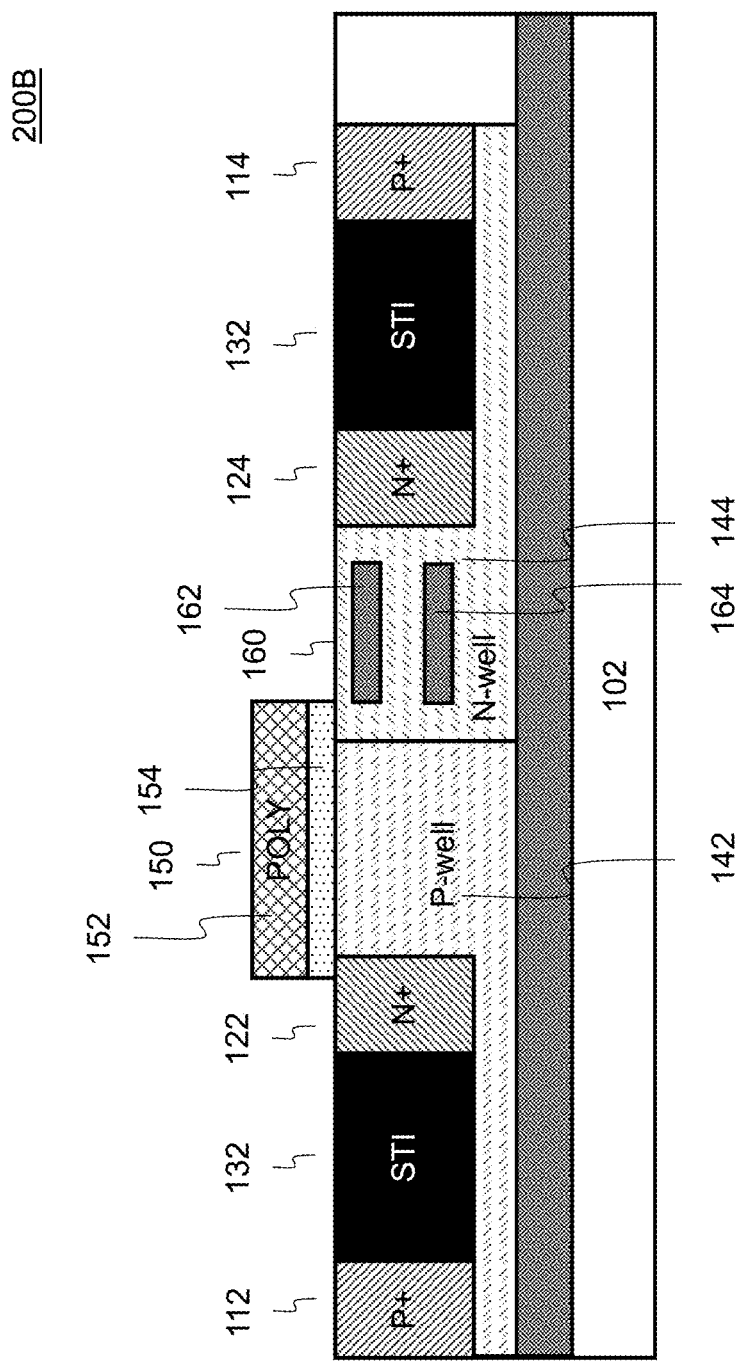
Figure 2C:
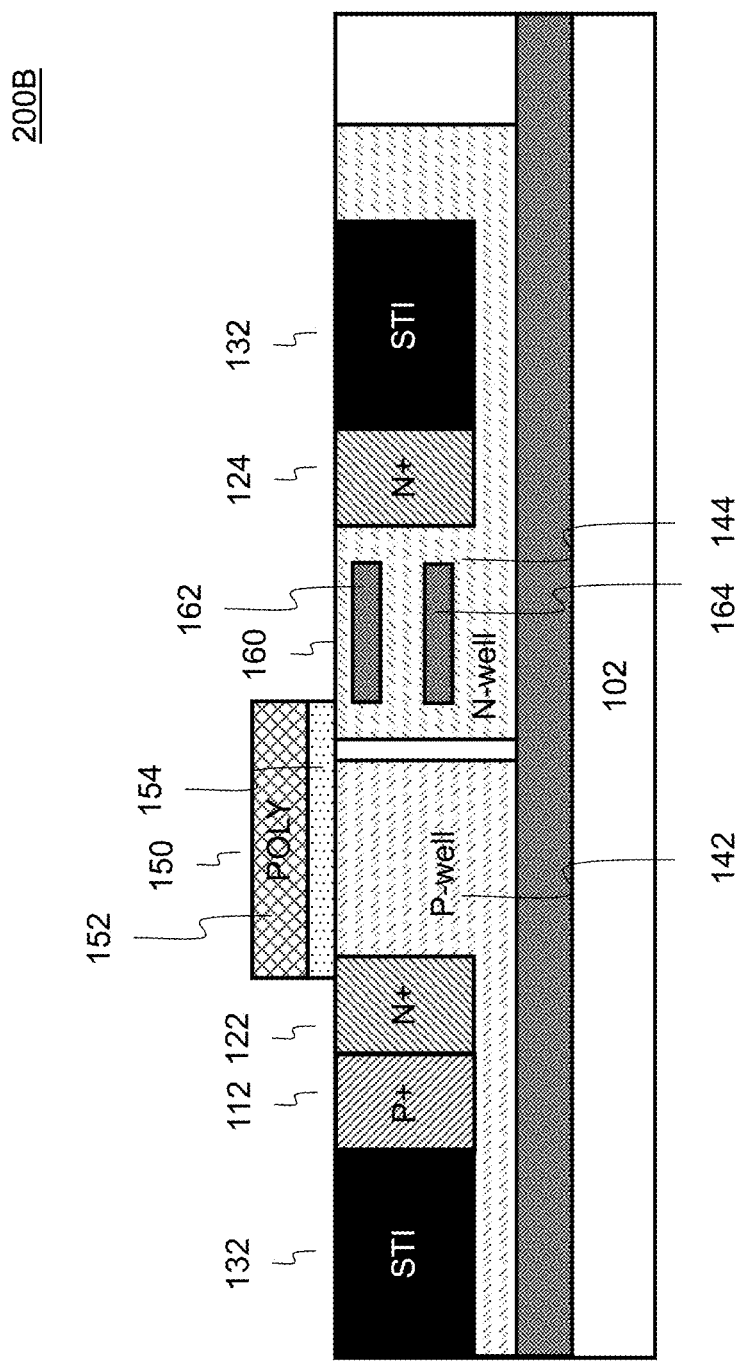

FIGS. 2A-2C show simplified cross-sectional views of other MOSFET devices according to various non-limiting embodiments of the present disclosure. In various embodiments, a device 100 may further include a deep high resistance layer. Referring to FIG. 2A, a device 200 may further include a deep high resistance isolation layer 104 in the substrate 102. The deep high resistance isolation layer 104 may be disposed below the first doped region 142 and the second doped region 144. The deep high resistance isolation layer 104 may be disposed to continuously extend across at least the device portion 101.

In various embodiments, the deep high resistance isolation layer 104 may be a buried oxide layer. In various embodiments, the deep high resistance isolation layer 104 may be a deep amorphous layer. The deep amorphous layer may be provided by performing ion implantations deep into the semiconductor substrate 102. The process may be similar to the process described herein with respect to providing an amorphous layer in the drift region.

In various embodiments, a device 100 may include a deep high resistance layer and a plurality of embedded high resistance regions. Referring to FIG. 2B, a device 200B may further include a deep high resistance isolation layer 104 in the substrate 102 and a plurality of high resistance regions 160 (e.g., two high resistance regions 162, 164) embedded in the drift region.

Referring to FIGS. 2A-2C, in the non-limiting example illustrated, the first conductivity type is shown as a P type and the second conductivity type is shown as an N type. However, in various other examples, the first conductivity type may be an N type and the second conductivity type may be a P type.

Figure 3A:
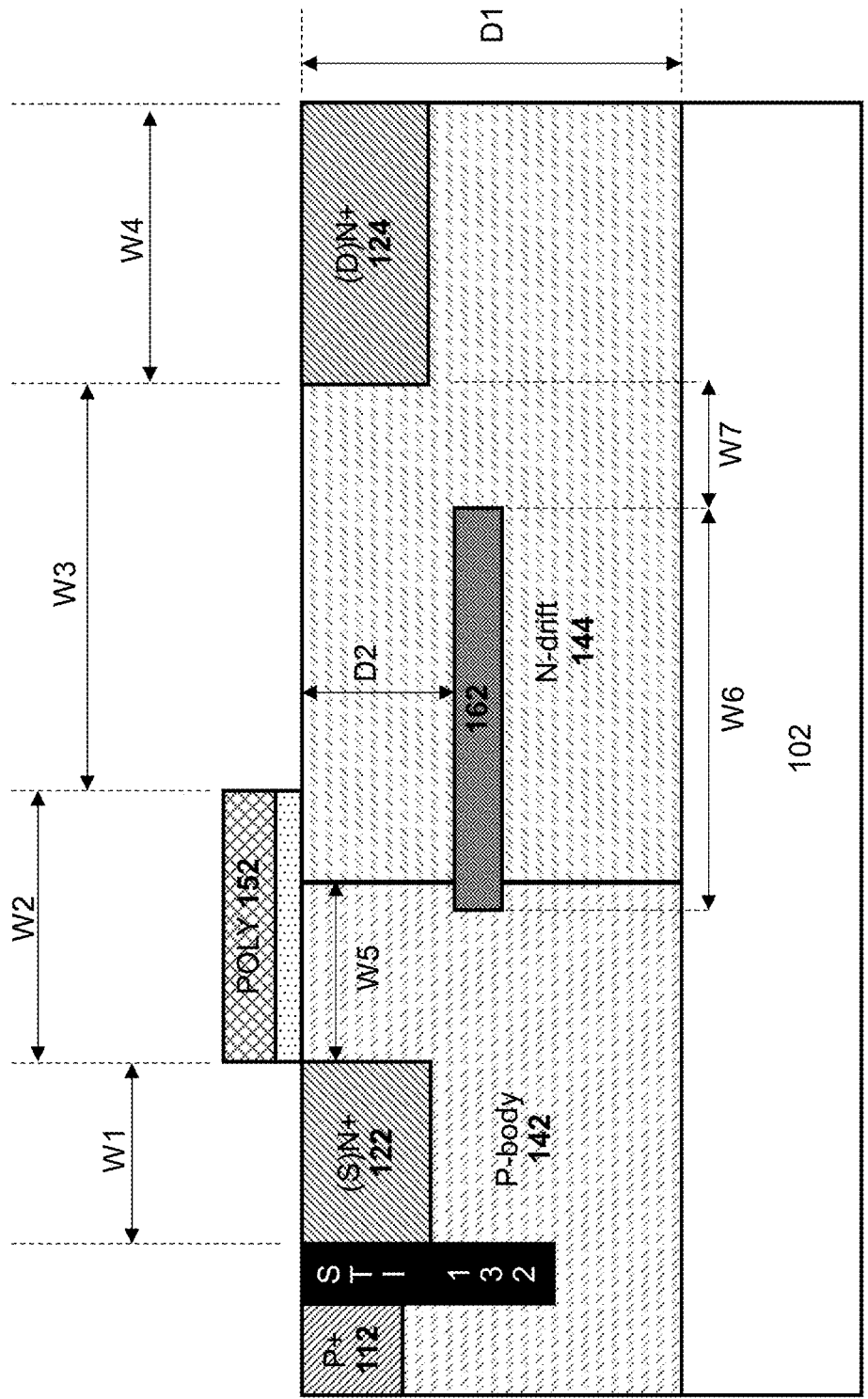
FIGS. 3A and 3B show simplified cross-sectional views of MOSFET devices according to various non-limiting embodiments of the present disclosure.
Figure 3B:
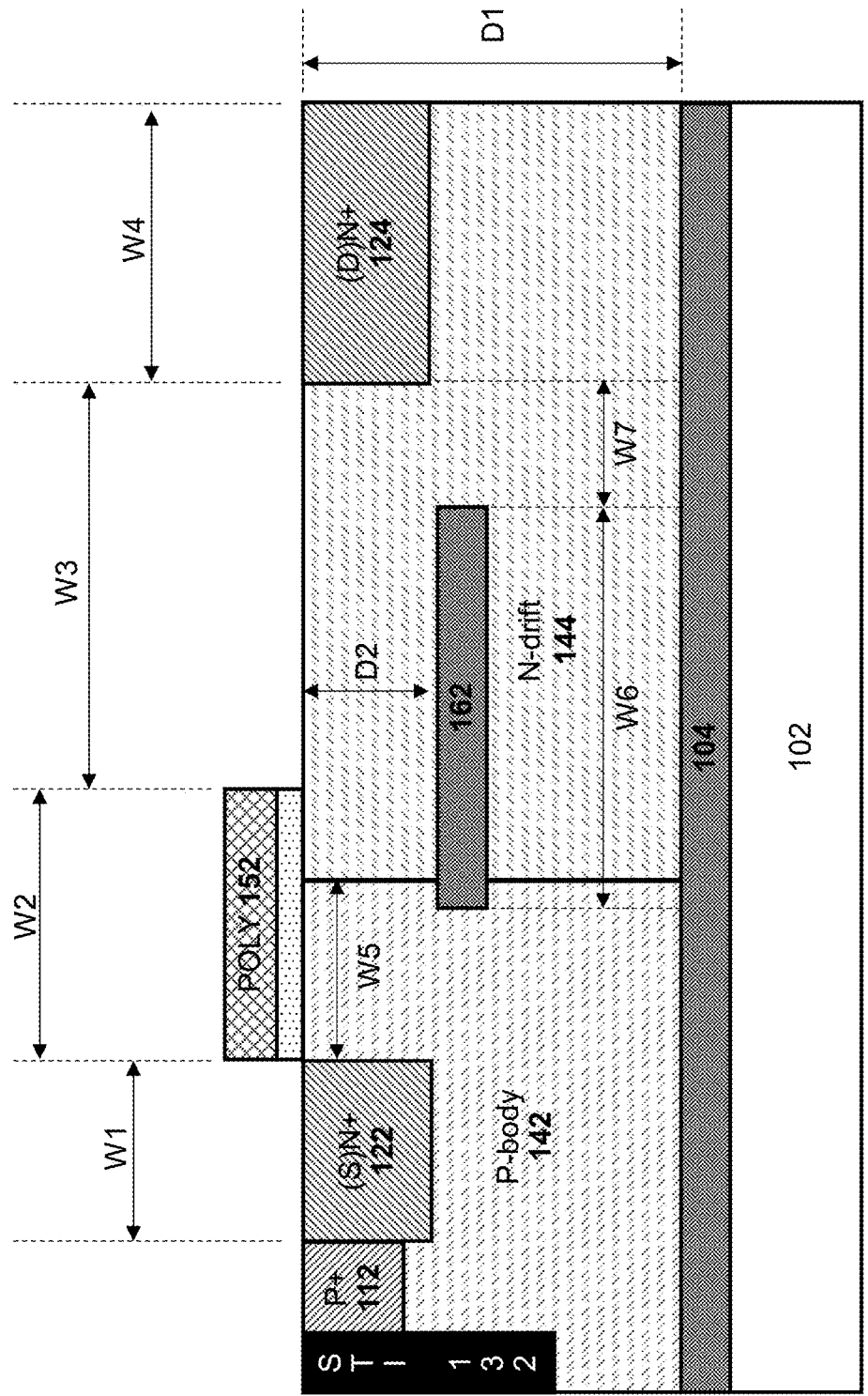

FIGS. 3A and 3B show simplified cross-sectional views of MOSFET devices according to various non-limiting embodiments of the present disclosure. The third doped region 122 may have a width W1 of about 0.33 μm. The gate 150 may have a width W2 of about 0.5 μm. The drift distance may have a width W3 of about 0.75 μm. The fourth doped region 124 may have a width W4 of about 0.52 μm.

The first doped region 142 may have a portion under the gate 150 and between the third doped region 122 and the second doped region 144 with a width W5 of about 0.34 μm. The first doped region 142 and the second doped region 144 may have a depth D1 of about 0.7 μm. The at least one high resistance region 162 may have a width W6 and be disposed at a depth D2 below the surface of the substrate. The depth D2 should be less than the depth D1. The width W6 depends on the drift distance W3. The at least one high resistance region 162 may be spaced apart from fourth doped region 124 by a width W7. The width W7 may be greater than 0.05 μm.

Figure 9:
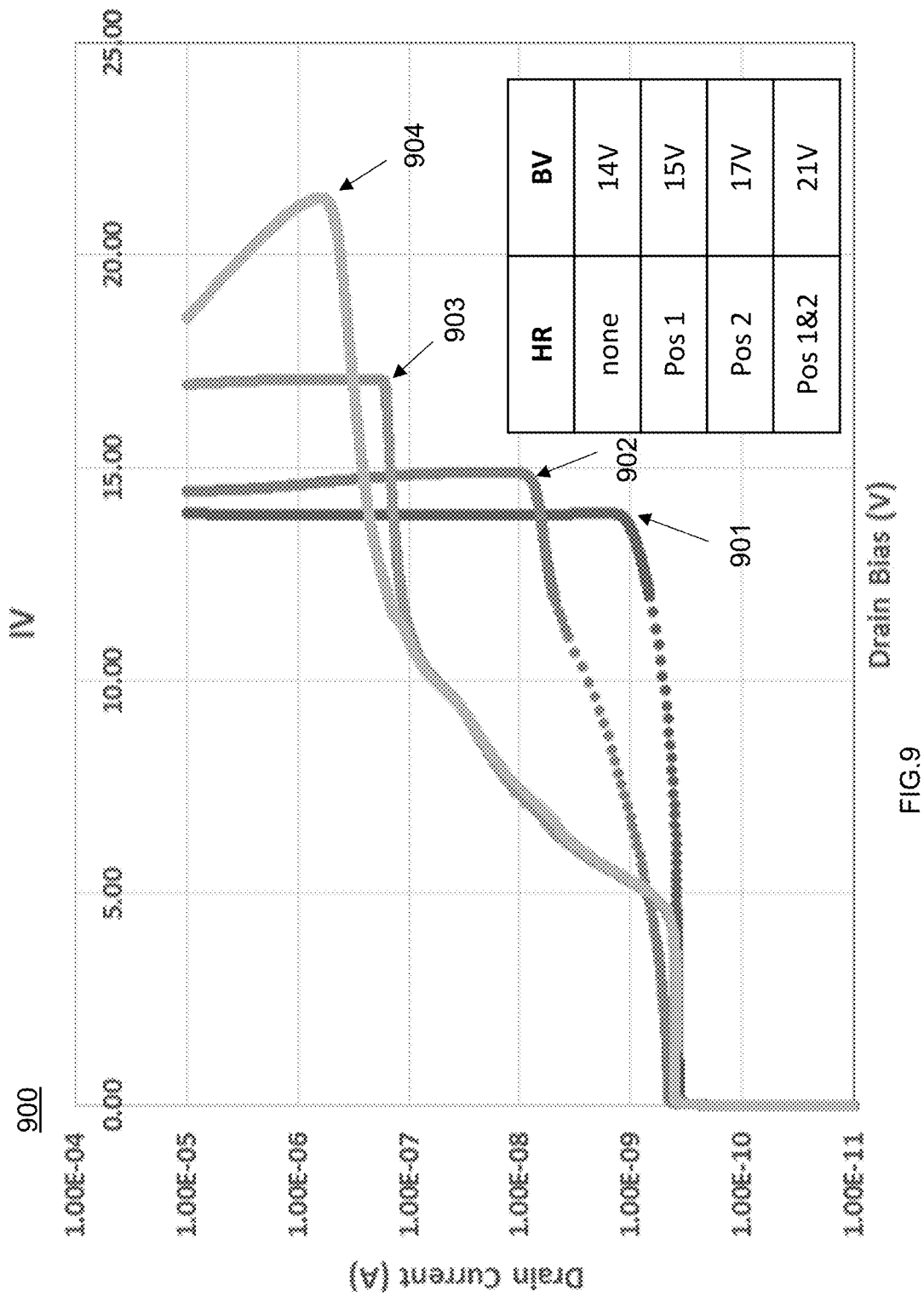
FIG. 9 is an IV plot diagram illustrating breakdown voltages of various devices according to the present disclosure.

FIG. 9 is an IV plot diagram illustrating breakdown voltages of various devices according to the present disclosure. Referring to FIG. 9, plot 901 refers to a device without any high resistance region in the drift region. The breakdown voltage for this device is about 14 V. Plot 902 refers to a device with a high resistance region 162 at a shallow depth in the drift region. The breakdown voltage for this device is about 15 V. Plot 903 refers to a device with a high resistance region 162 at a deep depth in the drift region. The breakdown voltage for this device is about 17 V. Plot 904 refers to a device with two high resistance regions 162, 164 at a shallow depth and a deep depth in the drift region. The breakdown voltage for this device is 21 V.

Figure 10:
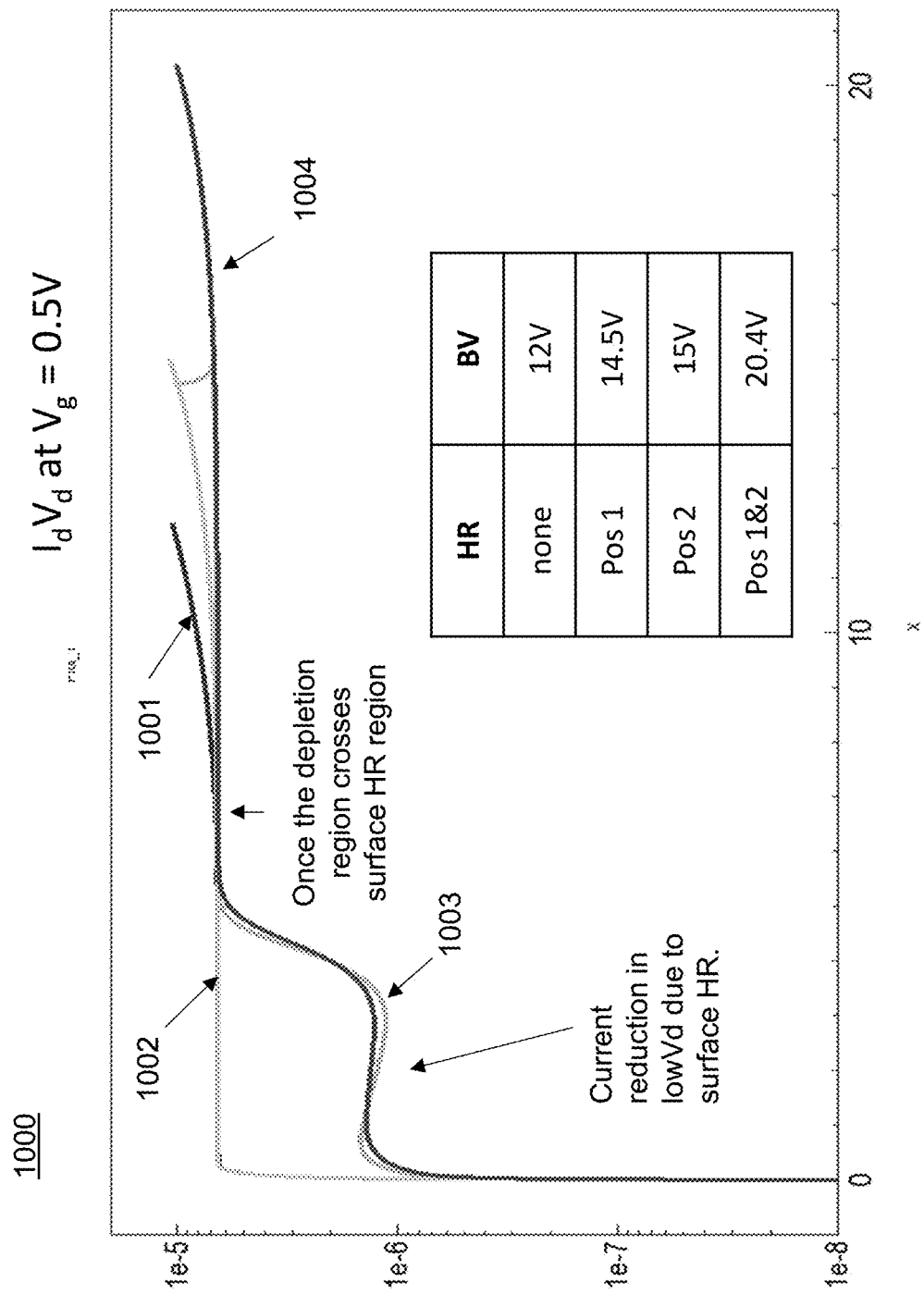
FIG. 10 is an $I_d V_d$ plot diagram at constant $V_g$ illustrating breakdown voltages of various devices according to the present disclosure.

FIG. 10 is an $I_dV_d$ plot diagram at constant $V_g$ illustrating breakdown voltages of various devices according to the present disclosure. Referring to FIG. 10, plot 1001 refers to a device without any high resistance region in the drift region. The breakdown voltage for this device is about 12 V. Plot 1002 refers to a device with a high resistance region 162 at a shallow depth in the drift region. The breakdown voltage for this device is about 14.5 V. Plot 1003 refers to a device with a high resistance region 162 at a deep depth in the drift region. The breakdown voltage for this device is about 15 V. Plot 1004 refers to a device with two high resistance regions 162, 164 at a shallow depth and a deep depth in the drift region. The breakdown voltage for this device is 20.4 V. The $I_dV_d$ at $V_g$=0.5 V plot indicates that there is no degradation in drain current. Moreover, the breakdown voltage is higher.

Figure 7:
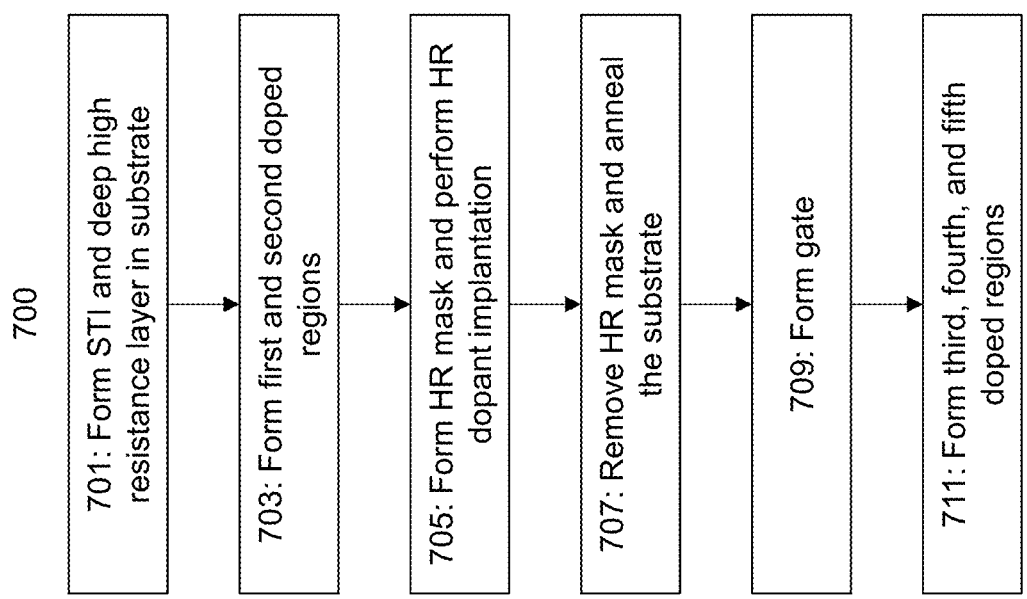
FIG. 7 shows simplified flow diagram illustrating a process for fabricating the device according to various non-limiting embodiments.

FIGS. 4A to 4J show simplified cross-sectional views illustrating a process 700 for fabricating the device 200 according to various non-limiting embodiments. For clarity of illustration, some reference numerals are omitted from FIGS. 4A to 4J. FIG. 7 shows simplified flow diagram illustrating a process 700 for fabricating the device 200 according to various non-limiting embodiments.

Referring to FIGS. 4A and 7, at 701, an isolation member and/or an insulation layer may be formed. For example, a semiconductor substrate 102 including an STI 132 and deep high resistance layer 104 is provided. The STI 132 may be formed in the substrate using conventional methods. The deep high resistance layer 104 may be formed in the substrate as a buried oxide layer or an amorphous layer. The buried oxide layer may be formed in the substrate using conventional methods. The amorphous layer may be formed in the substrate using the process described herein. The formation of the deep high resistance layer 104 may be omitted for fabricating the device 100 according to various non-limiting embodiments. The formation of the STI 132 may be omitted according to various non-limiting embodiments.

Referring to FIGS. 4B and 7, at 703, one or more wells may be formed. For example, a semiconductor substrate 102 further including a first doped region 142 (e.g., P-well) and a second doped region 144 (e.g. N-well) is provided. The first doped region 142 may have a first conductivity type.

The second doped region 144 may have a second conductivity type. The first and second doped regions 142, 144 may be formed in the substrate using conventional methods.

Figure 4F:
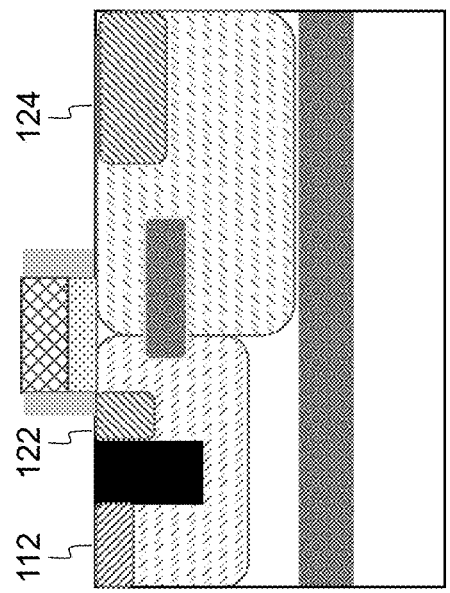

Referring to FIGS. 4C and 7, at 705, one or more masks may be formed and/or one or more HR dopant implantations may be performed. For example, a semiconductor substrate 102 further including a mask (e.g., photoresist) for a HR region 162 is provided. An HR dopant implantation may be performed as described herein. FIGS. 4G-4J illustrate alternative arrangements for the HR region in the drift region. For example, FIGS. 4G-4J show one or more HR regions only partially overlapped by the gate. Additionally, FIG. 4G shows an HR region at a shallow depth, FIG. 4H shows an HR region at a deep depth, FIG. 4I shows an HR region at an intermediate depth, and FIG. 4J shows two HR regions at two different depths to form a stack.

Referring to FIGS. 4D and 7, at 707, one or more masks may be removed and one or more annealing may be performed. For example, a semiconductor substrate 102 further including an HR region 162 is provided. The mask for the HR region may be removed (e.g., resist stripping) and the substrate 102 may be annealed after the implantation.

Figure 4E:
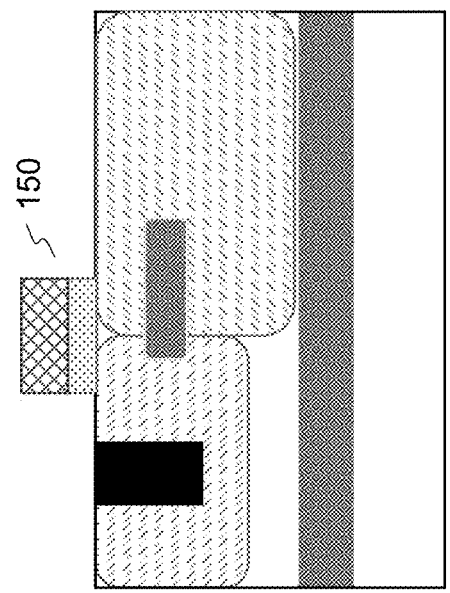
Figure 4G:
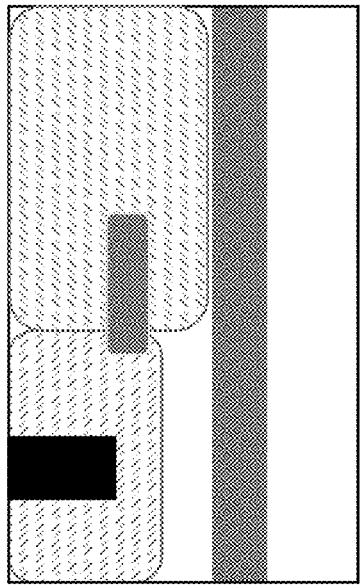
Figure 4H:
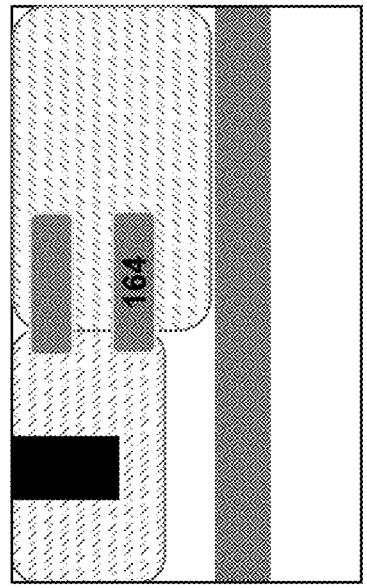
Figure 4I:
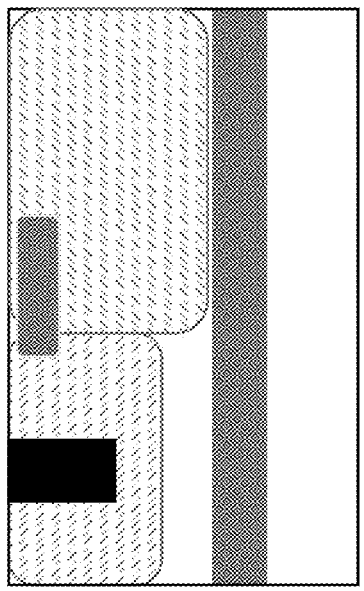
Figure 4J:
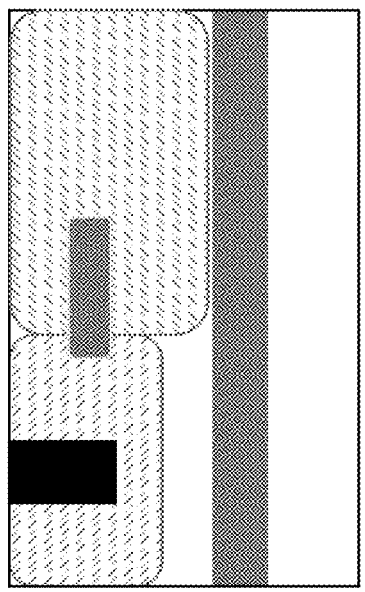

Referring to FIGS. 4E and 7, at 709, a gate may be formed. For example, a semiconductor substrate 102 further including a gate 150 is provided. The gate 150 (e.g., gate oxide and poly-gate) may be formed on the substrate using conventional methods.

Referring to FIGS. 4F and 7, at 711, source, drain and contacts may be formed. For example, a semiconductor substrate 102 further including a third doped region 122 (e.g., source), a fourth doped region 124 (e.g. extended drain), and a fifth doped region 112 (e.g., body contact) is provided. The third doped region 122 may have a second conductivity type. The fourth doped region 124 may have a second conductivity type. The fifth doped region 112 may have a first conductivity type. The third, fourth, and fifth doped regions 122, 124, 112 may be formed in the substrate using conventional methods.

Figure 8:
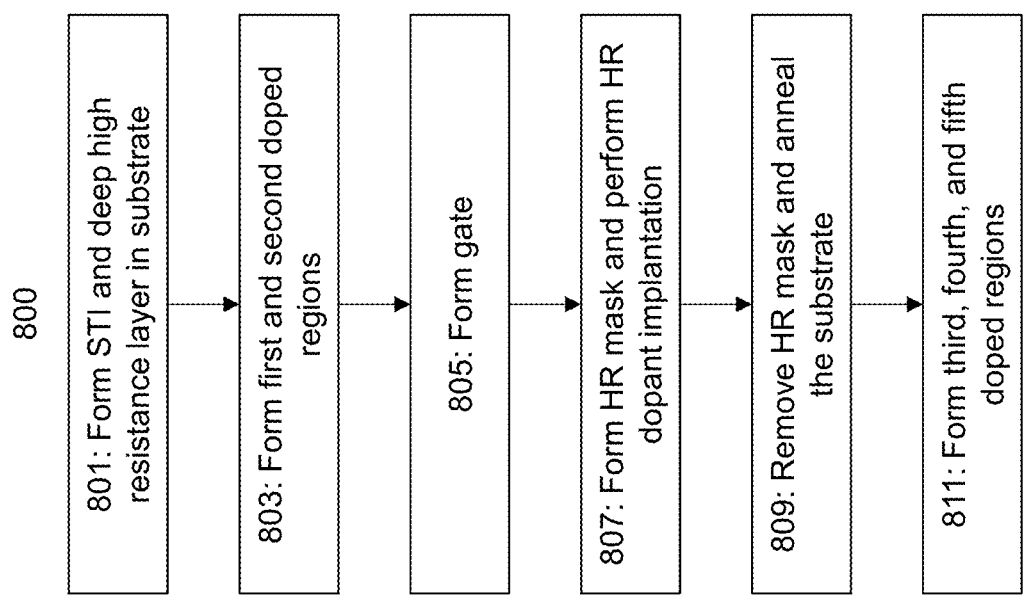
FIG. 8 shows simplified flow diagram illustrating a process for fabricating the device according to various non-limiting embodiments.

FIGS. 5A to 5J show simplified cross-sectional views illustrating a process 800 for fabricating the device 200 according to various non-limiting embodiments. For clarity of illustration, some reference numerals are omitted from FIGS. 5A to 5J. FIG. 8 shows simplified flow diagram illustrating a process 800 for fabricating the device 200 according to various non-limiting embodiments.

Figure 5A:
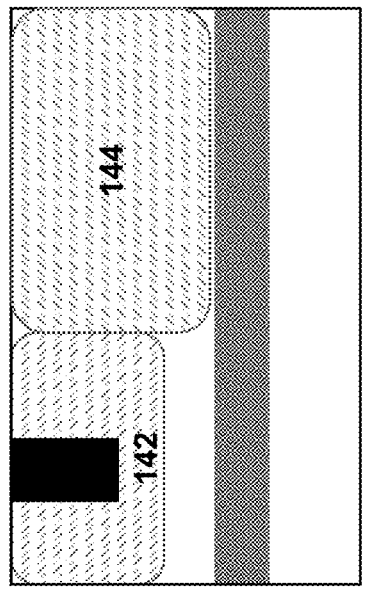
FIGS. 5A to 5J show simplified cross-sectional views illustrating a process for fabricating MOSFET devices according to various non-limiting embodiments.

Referring to FIGS. 5A and 8, at 801, an isolation member and/or an insulation layer may be formed. For example, a semiconductor substrate 102 including an STI 132 and deep high resistance layer 104 is provided. The STI 132 may be formed in the substrate using conventional methods. The deep high resistance layer 104 may be formed in the substrate as a buried oxide layer or an amorphous layer. The buried oxide layer may be formed in the substrate using conventional methods. The amorphous layer may be formed in the substrate using the process described herein. The formation of the deep high resistance layer 104 may be omitted for fabricating the device 100 according to various non-limiting embodiments. The formation of the STI 132 may be omitted according to various non-limiting embodiments.

Figure 5B:
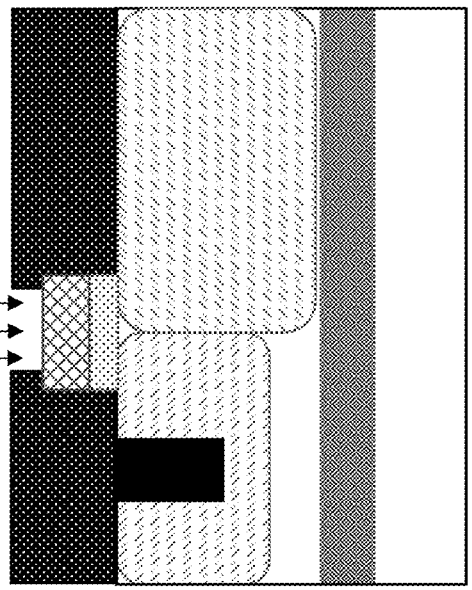

Referring to FIGS. 5B and 8, at 803, one or more wells may be formed. For example, a semiconductor substrate 102 further including a first doped region 142 (e.g., P-well) and a second doped region 144 (e.g. N-well) is provided. The first doped region 142 may have a first conductivity type. The second doped region 144 may have a second conductivity type. The first and second doped regions 142, 144 may be formed in the substrate using conventional methods.

Figure 5C:
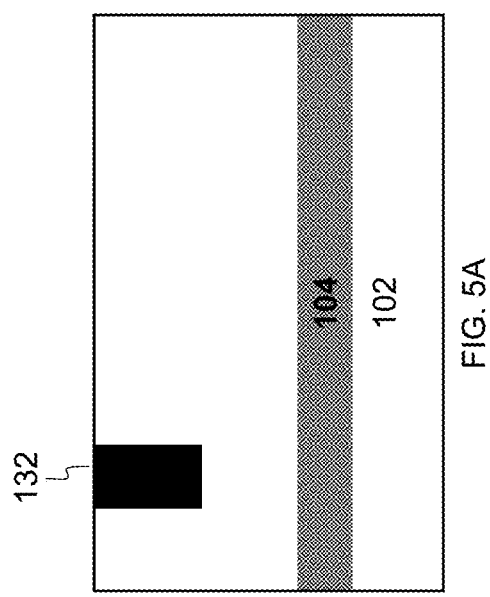

Referring to FIGS. 5C and 8, at 805, a gate may be formed. For example, a semiconductor substrate 102 further including a gate 150 is provided. The gate 150 (e.g., gate oxide and poly-gate) may be formed on the substrate using conventional methods.

Figure 5D:
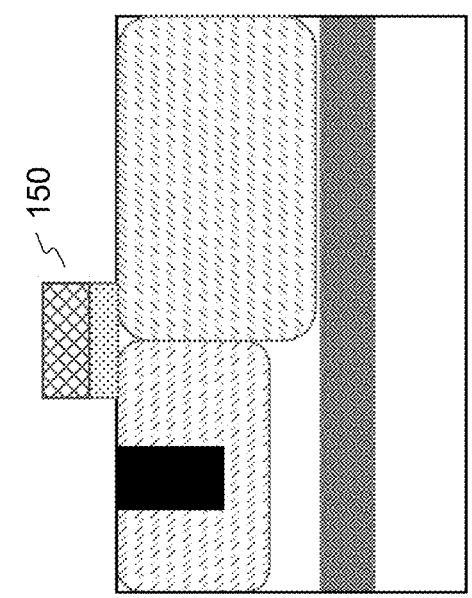
Figure 5F:
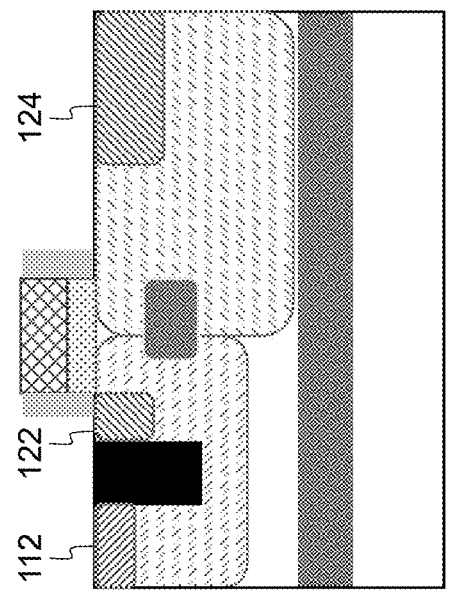

Referring to FIGS. 5D and 8, at 807, one or more masks may be formed and/or one or more HR dopant implantations may be performed. For example, a semiconductor substrate 102 further including a mask for a HR region 162 is provided. An HR dopant implantation may be performed as described herein. FIGS. 5G-5J illustrate alternative positions for the HR region in the drift region. For example, FIGS. 5G-5J show one or more HR regions completely overlapped by the gate. Additionally, FIG. 5G shows an HR region at a shallow depth, FIG. 5H shows an HR region at a deep depth, FIG. 5I shows an HR region at an intermediate depth, and FIG. 5J shows two HR regions at two different depths to form a stack.

Figure 5E:
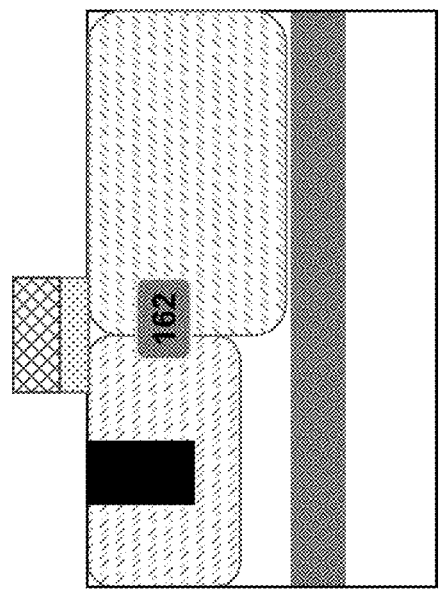
Figure 5H:
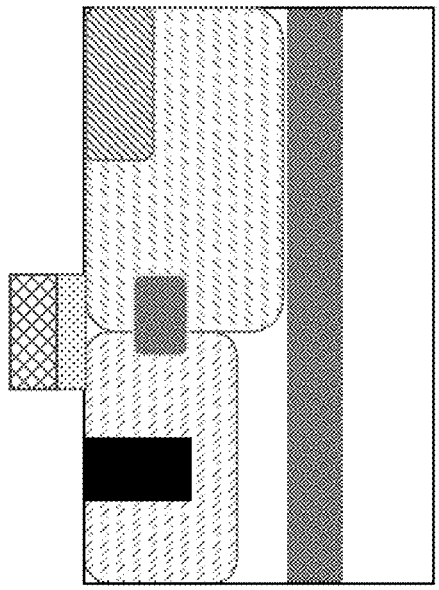
Figure 5J:
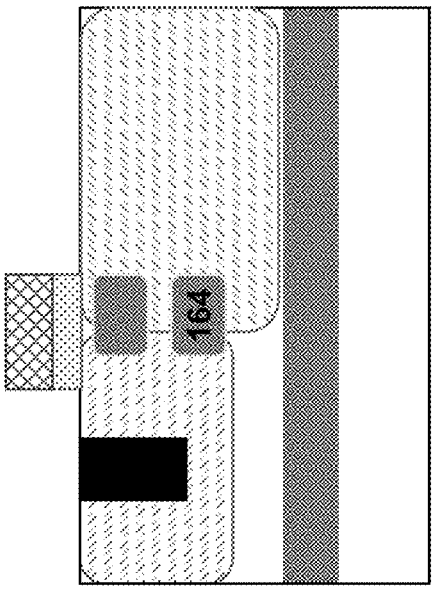
Figure 5G:
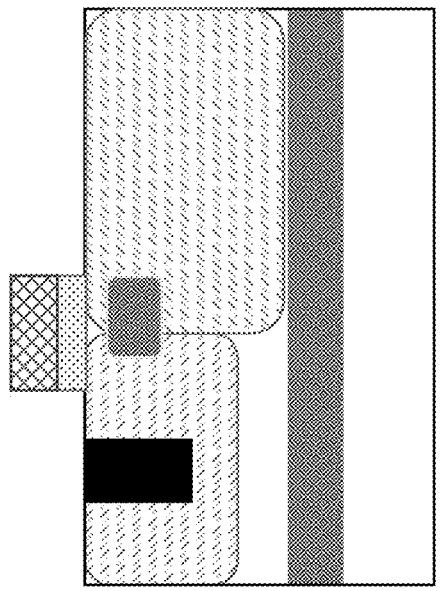
Figure 5I:
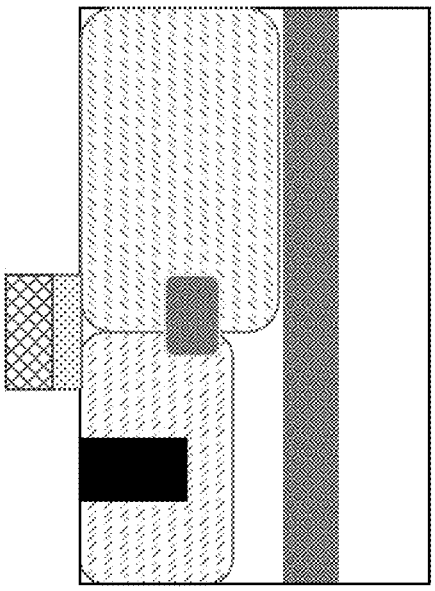

Referring to FIGS. 5E and 8, at 809, one or more masks may be removed and one or more annealing may be performed. For example, a semiconductor substrate 102 further including an HR region 162 is provided. The mask for the HR region may be removed and the substrate 102 may be annealed after the implantation.

Referring to FIGS. 5F and 8, at 811, source, drain and contacts may be formed. For example, a semiconductor substrate 102 further including a third doped region 122 (e.g., source), a fourth doped region 124 (e.g. extended drain), and a fifth doped region 112 (e.g., body contact) is provided. The third doped region 122 may have a second conductivity type. The fourth doped region 124 may have a second conductivity type. The fifth doped region 112 may have a first conductivity type. The third, fourth, and fifth doped regions 122, 124, 112 may be formed in the substrate using conventional methods.

FIGS. 6A to 6D show simplified cross-sectional views of additional various configurations of the high resistance layer according to various non-limiting embodiments. FIGS. 6A-6D illustrate additional alternative positions for the HR region in the drift region. For example, FIGS. 6A-6D show one or more HR regions not overlapped by the gate. Additionally, FIG. 6A shows an HR region at an intermediate depth, FIG. 6B shows two HR regions at two different depths to form a stepped stack configuration, FIG. 6C shows two HR regions at two different depths to form another stepped stack configuration, and FIG. 6D shows two HR regions at two different depths and having two different lengths in a stack configuration.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
   a substrate;
   a first doped region disposed in the substrate;
   a second doped region disposed in the substrate, wherein the first doped region and the second doped region are laterally adjacent to each other;
   a third doped region disposed in the first doped region;

a fourth doped region disposed in the second doped region;

a gate disposed on the substrate, over the first and second doped regions, and between the third and fourth doped regions; and at least one high resistance region embedded in at least the second doped region, wherein the at least one high resistance region is vertically spaced apart from a top surface of the second doped region and vertically spaced apart from a bottom surface of the second doped region, wherein the at least one high resistance region comprises at least one amorphous semiconductor layer, wherein the first doped region has a first conductivity type, wherein the second doped region, the third doped region, and the fourth doped region have a second conductivity type, wherein the first conductivity type and the second conductivity type are different.

2. The semiconductor device of claim 1, wherein the at least one high resistance region is embedded at a depth below a surface of the substrate in the second doped region and above a depth of the second doped region.

3. The semiconductor device of claim 1, wherein the at least one high resistance region is disposed between the third doped region and the fourth doped region so as to be spaced apart from the third doped region and the fourth doped region.

4. The semiconductor device of claim 3, wherein at least half of the at least one high resistance region is embedded in the second doped region.

5. The semiconductor device of claim 4, wherein a substantial portion of the at least one high resistance region is embedded in the second doped region.

6. The semiconductor device of claim 4, wherein the at least one high resistance region is completely embedded in the second doped region.

7. The semiconductor device of claim 4, wherein the at least one high resistance region comprises a plurality of high resistance regions arranged in a stack.

8. The semiconductor device of claim 7, wherein the plurality of high resistance regions arranged in a step-like stack.

9. The semiconductor device of claim 4, wherein the at least one high resistance region comprises a first high resistance region and a second high resistance region, the first high resistance region disposed over the second high resistance region.

10. The semiconductor device of claim 9, wherein the first high resistance region overlaps the second high resistance region.

11. The semiconductor device of claim 10, wherein the first high resistance region completely overlaps the second high resistance region.

12. The semiconductor device of claim 4, further comprising:

a deep high resistance layer disposed in the substrate and extending under the first doped region and the second doped region.

13. The semiconductor device of claim 12, wherein the deep high resistance layer comprises a buried oxide layer or an amorphous semiconductor layer.

14. The semiconductor device of claim 4, further comprising:

a fifth doped region disposed in the first doped region, the fifth doped region having the first conductivity type, wherein the fifth doped region is in direct contact with the third doped region.

15. The semiconductor device of claim 4, wherein the gate overlaps at least a portion of the at least one high resistance region.

16. The semiconductor device of claim 4, wherein the gate completely overlaps the at least one high resistance region.

17. The semiconductor device of claim 4, wherein the gate does not overlap the at least one high resistance region.

18. The semiconductor device of claim 4, wherein the first doped region is a well region, the second doped region is a drift region, the third doped region is a source region, and the fourth doped region is a drain region.

19. The semiconductor device of claim 1, wherein the at least one amorphous semiconductor layer comprises implanted energetic ions.

20. The semiconductor device of claim 19, wherein the implanted energetic ions have different kinetic energy.

* * * * *